United States Patent [19]

Kim

[11] Patent Number: 5,530,770
[45] Date of Patent: *Jun. 25, 1996

[54] MULTIPLE OUTPUT TRANSFORMERS NETWORK FOR SOUND REPRODUCING SYSTEM

[76] Inventor: Man H. Kim, 19422 Sturgess Dr., Torrance, Calif. 90503

[*] Notice: The portion of the term of this patent subsequent to Jul. 5, 2011, has been disclaimed.

[21] Appl. No.: 225,838

[22] Filed: Apr. 11, 1994

[51] Int. Cl.$^6$ .............................. H03F 21/00; H03G 5/00
[52] U.S. Cl. .................. 381/120; 381/77; 381/99
[58] Field of Search ................................ 381/120, 77, 78, 381/99; 330/195, 196, 197, 185, 186, 188, 190

[56] References Cited

U.S. PATENT DOCUMENTS 2,285,769  6/1942  Forster ........................................ 381/99
5,327,505  7/1994  Kim ........................................... 381/99

Primary Examiner—Forester W. Isen
Assistant Examiner—Xu Mei
Attorney, Agent, or Firm—Keith D. Beecher

[57] ABSTRACT

A multiple output transformer network for a high-fidelity sound reproducing system which includes a high-frequency speaker and a low-frequency speaker, first and second output transformers, a high-frequency bandpass filter coupling the secondary of the first output transformer to the high-frequency speaker, and a low-frequency bandpass filter coupling the secondary of the second transformer to the second speaker, all mounted in a remote speaker unit. The primary windings of the transformers are connected to the output amplifier of the sound reproducing equipment by first and second extension leads. The output amplifier includes first and second triodes series connected across a source of unidirectional potential, and first and second capacitors coupling the extension leads to the common connection of the triodes.

3 Claims, 1 Drawing Sheet

MULTIPLE OUTPUT TRANSFORMERS NETWORK FOR SOUND REPRODUCING SYSTEM

BACKGROUND OF THE INVENTION

The present invention is relates to high-fidelity sound reproducing systems and, more particularly, to systems such as described in co-pending application Ser. No. 07/825,054 filed Jan. 24, 1992 in the name of the present inventor, which issued as U.S. Pat. No. 5,327,505 on Jul. 5, 1994, and in which the output transformers of a sound reproducing unit are mounted in a separate speaker unit which is placed at a position remote from the main amplifier of the sound reproducing unit.

It is usual in high-fidelity sound reproducing systems to use two or more speakers which cover complementary frequency ranges. Specifically, in two-speaker systems, a high-frequency speaker (tweeter or driver) and a low-frequency speaker (woofer) are provided with appropriate high-frequency and low-frequency bandpass filters with predetermined crossover characteristics so that audio output signals in the high frequency portion of the frequency range may be directed predominantly to the high-frequency speaker and signals in the mid and low-frequency portion of the frequency range may be directed predominantly to the low-frequency speaker.

In such a system, the output from the output audio power amplifier of the sound reproducing equipment is supplied to a passive crossover network which separates the high and low frequencies, thereby supplying the mid and low frequencies to the woofer and the high frequencies to the tweeter or driver.

To achieve realism in sound reproduction systems certain fundamental conditions must be satisfied, namely: the frequency range must include without frequency discrimination all audible components of the various sounds to be reproduced; the volume range must permit noiseless and distortionless reproduction of the entire range of intensity associated with the sounds; and the reverberation characteristics of the original sound must be approximated in the reproduced sound.

It has been found difficult in the prior art sound reproducing systems to fulfill some of the fundamental conditions listed above without resorting to relatively complex and expensive circuitry, especially in cases where the speakers are located at a position remote from the output power amplifier of the sound reproducing equipment.

Such difficulties are overcome in the systems described in the patent referred to above by locating the output transformers and the high-frequency/low-frequency bandpass filters in a remote speaker unit displaced from the output audio power amplifier of the sound reproducing equipment, and then by coupling primary windings of the output transformers to the audio output power amplifier by appropriate extension leads.

In the system described in the patent there are no appreciable energy losses or changes in frequency characteristics due to the extension leads, which occur in the prior art systems. The system of the patent also assures the complete separation of high and low frequency signals from the output amplifier. This is because the separated signals are delivered directly to the speakers.

The system of the patent also provides for the availability of completely independent volume controls for each speaker and assures distinct crossover characteristics for high and low-frequency components, and also for mid-frequency components if so desired.

For example, by overlapping frequencies independently, such as 20 Hz to 5,000 Hz for the low-frequency speaker, and 150 Hz to 20,000 Hz for the high-frequency speaker, faithful reproduction may be achieved, for solo performances of piano, violin and cello, for example, as well as for tenor and soprano singers.

Also, the system of the patent precludes distortions in the mid-frequency range when the low frequency filter is set, for example, to a range of 500 Hz to 4,000 Hz, with independent high-frequency separation for choruses, symphony orchestras, heavy metal music, etc. Specifically, the system of the patent permits the control of crossover, and independent control of volume in each frequency range so as to adapt the reproduction characteristics of the system to the sounds being reproduced.

In addition, overall efficiency is increased materially by the system of the patent because separation of the frequency ranges occurs at the remote speaker unit rather than at the output amplifier. The overall result is that sound is reproduced by the speakers at a selected decibel level with less energy being required as compared with present-day systems.

Moreover, damage to the speakers, such as burnout, is obviated in the system of the patent because the output signal from the output transformers is delivered directly to the voice coil of the speakers.

The system of the present invention provides a special type of audio power amplifier for the sound reproducing equipment which is particularly designed and constructed for use in one of the systems described in the patent and which assures optimum performance of the system.

DETAILED DESCRIPTION OF THE ILLUSTRATED EMBODIMENT

Figure 1:
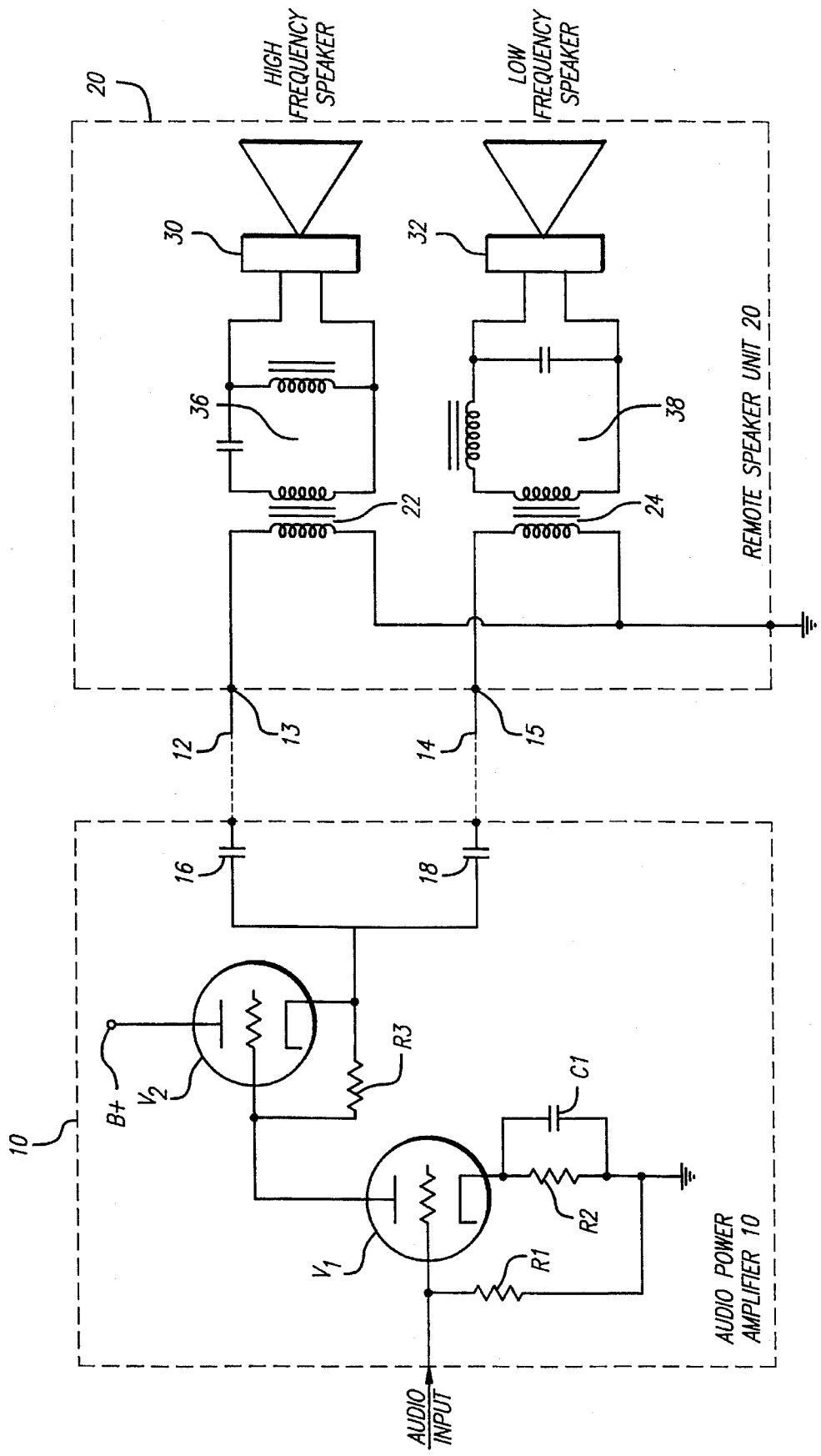
FIG. 1 is a schematic diagram, illustrating in circuit detail the output audio power amplifier of a particular sound reproducing unit constructed in accordance with the concepts of the present invention and connected to a remote speaker unit which includes output transformers connected in a multiple output network.

In the system of FIG. 1, the output audio power amplifier of a typical sound reproducing unit is designated 10. The output of the power amplifier is coupled to a pair of extension leads 12 and 14 by means of respective capacitors 16 and 18. The extension leads 12 and 14 are connected to the input terminals 13 and 15 of a remote speaker unit 20. The input terminals 13 and 15 are connected respectively to the primary windings of a pair of output transformer 22 and 24, the other terminals of the primary windings being grounded.

In the system of FIG. 1, the output transformers 22 and 24, instead of being incorporated into the audio power output amplifier 10 in the sound reproducing unit, are located in the remote speaker unit 20. The secondary windings of the output transformers 22 and 24 are coupled respectively to a high-frequency speaker (tweeter or driver) 30 and a low-frequency speaker (woofer) 32 through a high-pass filter network 36 and low-pass filter network 38, as shown.

In the system of FIG. 1, the extension leads 12 and 14 serve to couple the remote speaker unit 20 to the power amplifier 10 without any significant energy losses or changes in frequency characteristics which are inherent in the prior art systems in which the output transformers are located in the power amplifier of the sound reproducing equipment, as are the high-pass and low-pass filter networks 36 and 38. Accordingly, the cables connecting the sound reproducing equipment to the remote speakers in the prior art systems inherently exhibit energy losses and changes in frequency characteristics.

The system of FIG. 1 also assures complete separation of the high and low frequency signals from the output amplifier as the separated signals are delivered directly to the speakers.

The audio output power amplifier 10 is formed of a pair of triodes V1 and V2. The audio from the sound reproducing equipment is applied to the control electrode of diode V1. That control electrode is connected to a grounded resistor R1, and the cathode of triode V1 is connected to a grounded resistor R2 which is shunted by a capacitor C1.

The anode of triode V1 is connected to the control electrode of triode V2 which is connected to the cathode through a resistor R3. The anode of triode V2 is connected to the positive terminal of a source of unidirectional potential whose negative terminal is grounded.

The capacitors 16 and 18 are connected to the cathode of triode V2.

It will be appreciated that while a particular embodiment of the invention have been shown and described, modifications may be made. It is intended in the following claims to cover all such modifications which fall within the true spirit and scope of the invention.

I claim:

1. In sound reproducing equipment, the combination of: an audio output power amplifier and a remote speaker unit coupled to the audio output power amplifier; said speaker unit including first and second speakers, first and second output transformers having secondary windings respectively coupled to said first and second speakers, having primary windings connected to the output amplifier by first and second extension leads, a high-frequency bandpass filter coupling the secondary of the first transformer to the first speaker and a low-frequency bandpass filter coupling the secondary of the second transformer to the second speaker, said high-frequency and low-frequency bandpass filters having predetermined crossover characteristics, and said audio output power amplifier including first and second electron discharge devices series connected across a source of unidirectional potential, means for introducing the audio output of the sound reproducing equipment to one of said electron discharge devices, and first and second capacitors coupling the first and second extension leads via an impedance to the common connection between said first and second electron discharge devices, in which said electron discharge devices are first and second triodes and each has an anode, a cathode and a control electrode, and in which said anode of said first triode is connected to the control electrode of said second triode and through a first resistor to the cathode of said second triode, said first resistor being said impedance, and in which said first and second capacitors are connected to the cathode of said second triode, in which the control electrode of said first triode is connected to a grounded second resistor, and the cathode of said first triode is connected to a grounded third resistor shunted by a third capacitor.

2. The combination defined in claim 1 and which includes a third resistor connected to the control electrode and cathode of said second triode.

3. The combination defined in claim 1 in which the anode of said second triode is connected to the positive terminal of a source of unidirectional potential whose negative terminal is grounded.

* * * * *